United States Patent [19]
Mittal et al.

[11] Patent Number: 6,099,939
[45] Date of Patent: *Aug. 8, 2000

[54] ENHANCED ADHESION BETWEEN A VAPOR DEPOSITED METAL AND AN ORGANIC POLYMER SURFACE EXHIBITING TAILORED MORPHOLOGY

[75] Inventors: Kashmiri L. Mittal, Hopewell Junction; Judith Marie Roldan, Ossining; Carlos Juan Sambucetti, Croton-on-Hudson; Ravi F. Saraf, Briarcliff Manor, all of N.Y.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/921,453

[22] Filed: Aug. 25, 1997

Related U.S. Application Data

[63] Continuation of application No. 08/421,342, Apr. 13, 1995, abandoned.

[51] Int. Cl.$^7$ ...................................................... B32B 15/08
[52] U.S. Cl. .......................... 428/161; 428/458; 428/457; 428/141; 427/250; 427/585; 427/593
[58] Field of Search ..................................... 428/458, 901, 428/457, 161, 141; 427/98, 96, 404, 99, 585, 593, 250

[56] References Cited

U.S. PATENT DOCUMENTS

| | | | |
|---|---|---|---|
| 3,821,016 | 6/1974 | DeAngelo | 430/324 |
| 4,152,195 | 5/1979 | Bahrle et al. | 156/656 |
| 4,347,306 | 8/1982 | Takeda et al. | 427/96 |
| 4,410,586 | 10/1983 | Ladizesky et al. | 428/245 |
| 4,710,403 | 12/1987 | Krause et al. | 427/304 |
| 4,975,327 | 12/1990 | Somasiri et al. | 428/409 |
| 5,130,192 | 7/1992 | Takabayashi et al. | 428/332 |
| 5,262,227 | 11/1993 | Takabayashi et al. | 428/215 |
| 5,310,580 | 5/1994 | O'Sullivan et al. | 427/307 |
| 5,670,262 | 9/1997 | Dalman | 328/458 |
| 5,908,334 | 6/1999 | Chen et al. | 439/824 |

FOREIGN PATENT DOCUMENTS 62-215631  9/1987  Japan.

OTHER PUBLICATIONS

Saraf et al. "Tailoring the surface morphology of polyimide for improved adhesion," *IBM Journal of Research and Development*, vol. 38, No. 4, Jul. 1994.

IBM Journal of Research and Development, vol. 38, No. 4, Jul. 1994.

*Primary Examiner*—Paul Thibodeau
*Assistant Examiner*—D. Lawrence Tarazano
*Attorney, Agent, or Firm*—McGinn & Gibb, PC

[57] ABSTRACT

Enhanced adhesion between a vapor deposited metal and an organic polymer surface is achieved without utilizing any intermediate surface preparatory steps. The morphology of the polymer surface is tailored to produce mounds and dimples on the surface which leads to a mechanically tougher, interdigitated metal/polymer interface. In the preferred embodiment, a solution of a solvent or solvent system and two or more polymer precursors or polymers or combinations thereof are cast in a film on a substrate and heated to spontaneously form a rough surface due to phase separation. The surface topography of such a film consists of characteristic mounds and dimples depending upon the composition of the solution. Direct metal vapor deposition onto the roughened surface results in an enhanced adhesion of the metal to the organic polymer surface. The organic polymer surface or substrate may be, but need not be, attached to yet another underlying substrate such as a ceramic (e.g., a silicon semiconductor chip), plastic or metal.

20 Claims, 6 Drawing Sheets

ENHANCED ADHESION BETWEEN A VAPOR DEPOSITED METAL AND AN ORGANIC POLYMER SURFACE EXHIBITING TAILORED MORPHOLOGY

This is a continuation application Ser. No. 08/421,342, filed on Apr. 13, 1995 now abandoned.

BACKGROUND OF THE INVENTION

1. Field of the Invention

The present invention relates to a method of achieving enhanced adhesion between a metal and an organic dielectric material, whenever the metal is deposited onto the organic layer by conventional vapor deposition techniques. Specifically, the invention relates to the direct use of a layer of organic dielectric material, exhibiting characteristic surface morphology and topography, for the purposes of metal vapor deposition without any intermediate surface preparatory step of cleaning and etching the organic layer. Quite specifically, the invention concerns the vapor deposition of copper, nickel, chromium or any other metal amenable to vapor deposition onto a specially prepared polymer surface, resulting in an adhesion that is a significant improvement over that observed in vapor deposition on a conventionally prepared polymer surface.

2. Description of the Prior Art

Metallic coatings on polymer surfaces have diverse applications ranging from lustrous finishes on plastic parts and improved solder adhesion on printed circuit boards, to applications in microelectronics, wherein, a polyimide (PI) layer is circuited using Copper lines. In the prior art, the techniques employed to deposit metal onto a polymer surface include evaporation, sputtering, dip coating in colloidal suspensions, electroplating and electroless plating. Typically, a metal layer has no inherent affinity with the inert polymer surface and hence, techniques to create and enhance such an affinity between the metal and the polymer surface are crucial to the integrity of this interface.

Methods of enhancing such an affinity include mechanical and chemical abrasion techniques. Mechanical abrasion techniques suffer the disadvantage of non-uniformity, and have long since been superseded by chemical abrasion methods. This is especially true in advanced applications such as high end microelectronics technology.

Chemical abrasion techniques typically involve etching using an alkaline bath. A smooth organic dielectric material is etched by NaOH or KOH solutions. A typical electroless plating technique involves roughening the polymer surface using etchants and subsequent catalytic seeding and metal plating. U.S. Pat. No. 5,310,580 (O'Sullivan et al.) discloses an improvement upon this electroless plating method by using an etchant on a spontaneously pre-roughened polyimide surface which results in an overall enhancement of the metal-polymer adhesion. U.S. Pat. No. 4,975,327 (Somasiri et al.) disclose a variant chemical abrasion procedure, wherein a polyimide film is coated with a chromium sublayer, and heated to give the oxide. Subsequent deposition of a metal by vapor deposition or electroless plating methods results in an enhanced adhesion. The hydrophilic asperities on the metallic oxide sublayer make it more receptive to subsequent metal deposition.

The use of a reactive chromium sublayer is a common method of achieving adhesion between vapor deposited metal and a polymer film substrate. Typically, a clean polymer surface is sputtered with chromium in the presence of oxygen. This results in a primed surface containing a layer of chromium oxide covalently bonded to the surface. Subsequent sputtering of a metal leads to an enhanced adhesion. The chief drawbacks of this method are: (a) the susceptibility of the chromium layer to hydrolysis, and a resultant weakening of the adhesion over a period of time and (b) an expensive plasma cleaning step using Ar ion sputtering or reactive ion (e.g., oxygen ion) bombardment. For example, in microelectronics, copper is deposited onto a $Cr^o$ primed surface of polyimide. The presence of Cr oxides at the Cu/PI interface affects the bond strength as measured by peel test measurements performed to determine the strength of adhesion.

Consequently, the best solution would be to achieve good adhesion of a conducting metal like copper without the use of any reactive metal sublayer like chromium.

The present invention relates to such a method of improving adhesion between vapor deposited metal and an organic polymer substrate without any special cleaning and surface modification steps that are usually employed.

SUMMARY OF THE INVENTION

The present invention provides a new and shorter route to metal vapor deposition onto organic polymer surfaces. The process, which results in improved adhesion of the metal, is easy to implement and can be performed with conventional spin coating and metal evaporation equipment. The principal feature of the current invention is the enhanced metal-polymer surface adhesion obtained without utilizing any conventional surface cleaning/etching procedures prior to vapor deposition. This is achieved by tailoring the morphology of the surface to produce topographical features at a nanoscale level.

When a blend, consisting of two or more polymer precursors or polymers, is cured, the blend separates into more than one phase. Curing is referred to as polymerization of precursors to longer chain lengths, cross-linking or simple evaporation of solvent(s) to convert the solution to a solid film. The type of surface topography, defined as mounds or dimples, is regulated by the blend composition. The characteristic length scale, i.e. size of mounds or dimples, is regulated by phase separation kinetics. Such a spontaneously roughened surface topography due to phase separation facilitates mechanical interlocking of a metal film and results in a more interdigitated and tougher metal-polymer interface.

In a preferred embodiment of the present invention, a mixture of polyamic acid (PAA), polyamic acid ester (PAETE) and a polar solvent (N-Methylpyrolidine (NMP)) were blended and spin coated, followed by a soft-bake at 70° C. The film was subsequently cured at 400° C. for 30 mins. 1 $\mu$M of copper was vapor deposited on the cured film. The film was subsequently electroplated with an additional 9 $\mu$M of copper. The resultant PI film showed a greater than 200% enhancement in the adhesion of copper as determined by peel tests.

The present invention is not limited to polyimide films. The invention is broadly applicable to any polymeric film that can be obtained from a blend consisting of two or more precursors of the polymer or polymers. Also, various ratios of the starting precursors or polymers can be employed in the initial blend.

Since there is no further surface treatment after the spontaneous nanoscale surface roughening, the enhancement observed in the adhesion is truly due to morphological and topographical modification at the interface such as mechanical interlocking and improved toughness of the interface.

The generic nature of such a binding mechanism implies a potential improvement in adhesion for any metal that is amenable to vapor deposition onto a polymer surface derived from two or more polymers or polymer precursors.

Thus, a principal objective of the present invention is to enhance the adhesion between a vapor deposited metal and an organic dielectric polymer substrate by employing a surface morphology that is tailored to produce an interdigitated metal-polymer interface.

A further objective of the present invention is the provision of an improved adhesion between vapor deposited copper and polyimide substrate without the use of a reactive sublayer.

The scope and the techniques of the present invention are further detailed below.

DETAILED DESCRIPTION

Prior to the present invention, organic substrate surfaces, were typically coated with a reactive layer (e.g. Chromium), primarily to make the surface more receptive to the deposition of metal vapor. The organic substrate surface may be, but need not be, attached to an underlying substrate such as a ceramic (e.g., semiconductor chip), plastic or metal. The present invention improves that process by tailoring the surface topography in a way that renders the addition of a reactive sublayer (e.g. Chromium) unnecessary, and yet, results in an enhanced adhesion of a vapor deposited metal.

Generally, the process of the invention begins by forming an organic dielectric layer on the surface of the substrate from a polymer blend of two or more polymers or polymer precursors or combinations thereof dissolved in a solvent or solvent system of two or more solvents.

Suitable polymer precursors include polyamic acid, polyamic acid ester, and oligomers of polyepoxide. Suitable polymers include polyimide, polyurethane, polyepoxide, polysulfane, polyether and polyamide. It is necessary, however, that such a blend separate into two or more phases upon curing.

In a first preferred method of practicing the present invention a ternary solution is formed. The solution contains Polyamic acid (PAA), Polyamic acid ester (PAETE) and a polar solvent, preferably NMP.

The solution is spin coated on a substrate to produce a two phase separated morphology. The spun layer is heated to a temperature sufficient to cure the PAA and the PAETE. For a PMDA-ODA system, the film is further heated to a temperature in the range between 300° and 400° C., and preferably 350° C., to induce differential order between the polyimides formed from the two precursors. 1000 Å of Cu is then vapor deposited using conventional processes.

Figure 1:
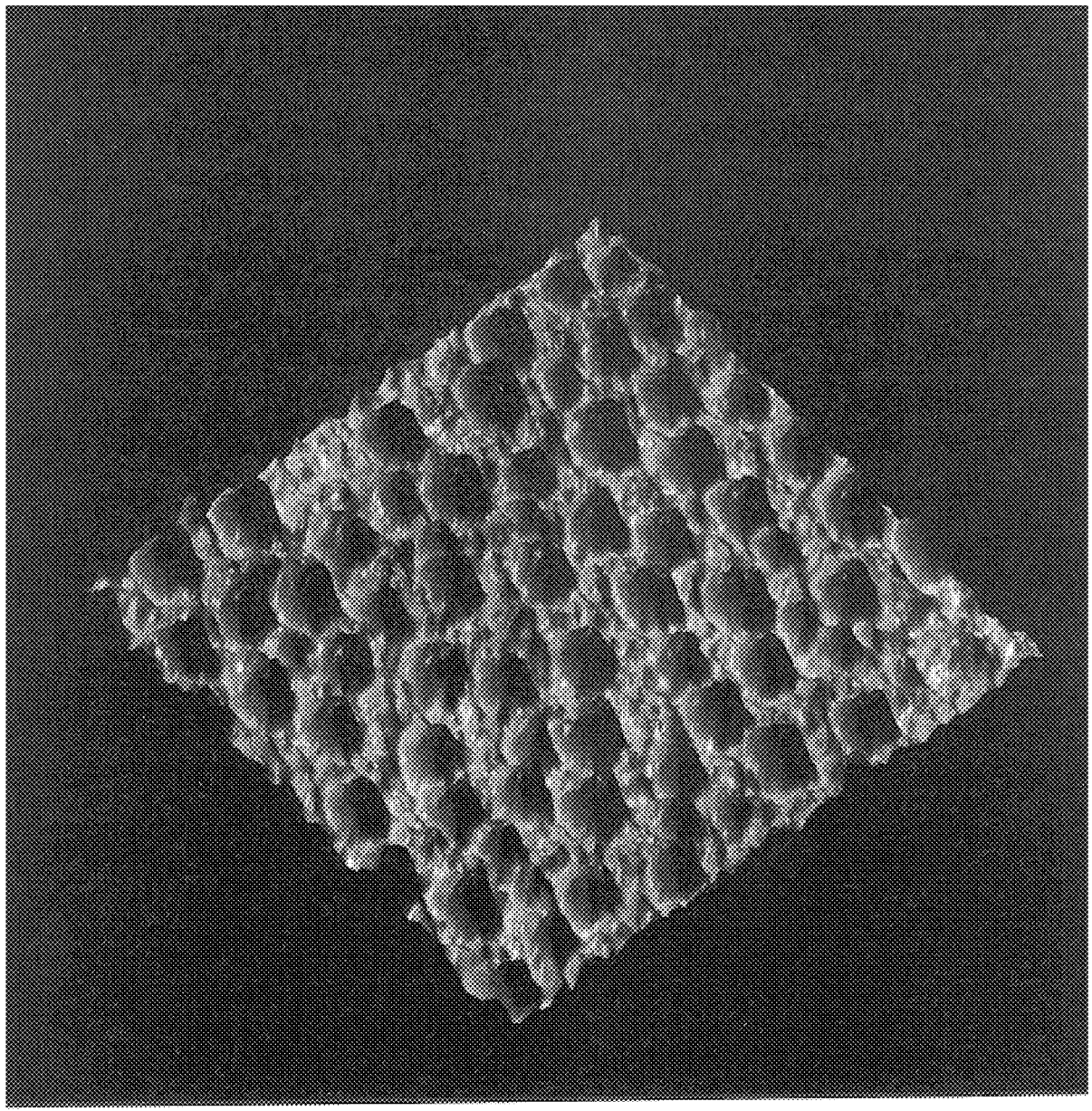
FIG. 1 is an Atomic Force Micrograph (AFM) of 20/80 (wt %) PAA/PAETE polyimide film prepared in accordance with this invention.
Figure 2:
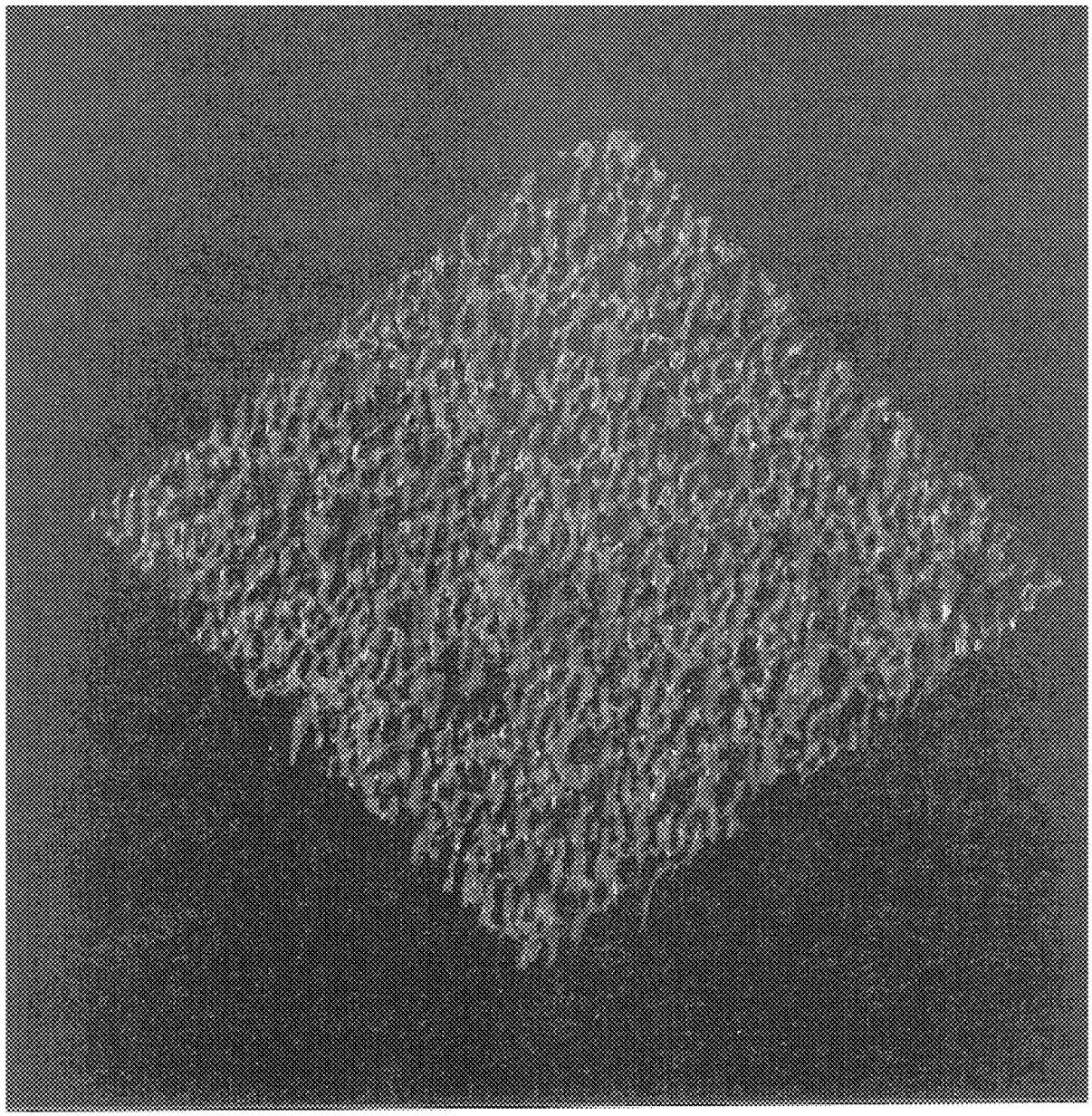
FIG. 2 is an AFM of 80/20 (wt %) PAA/PAETE polyimide film prepared in accordance with this invention.
Figure 3:
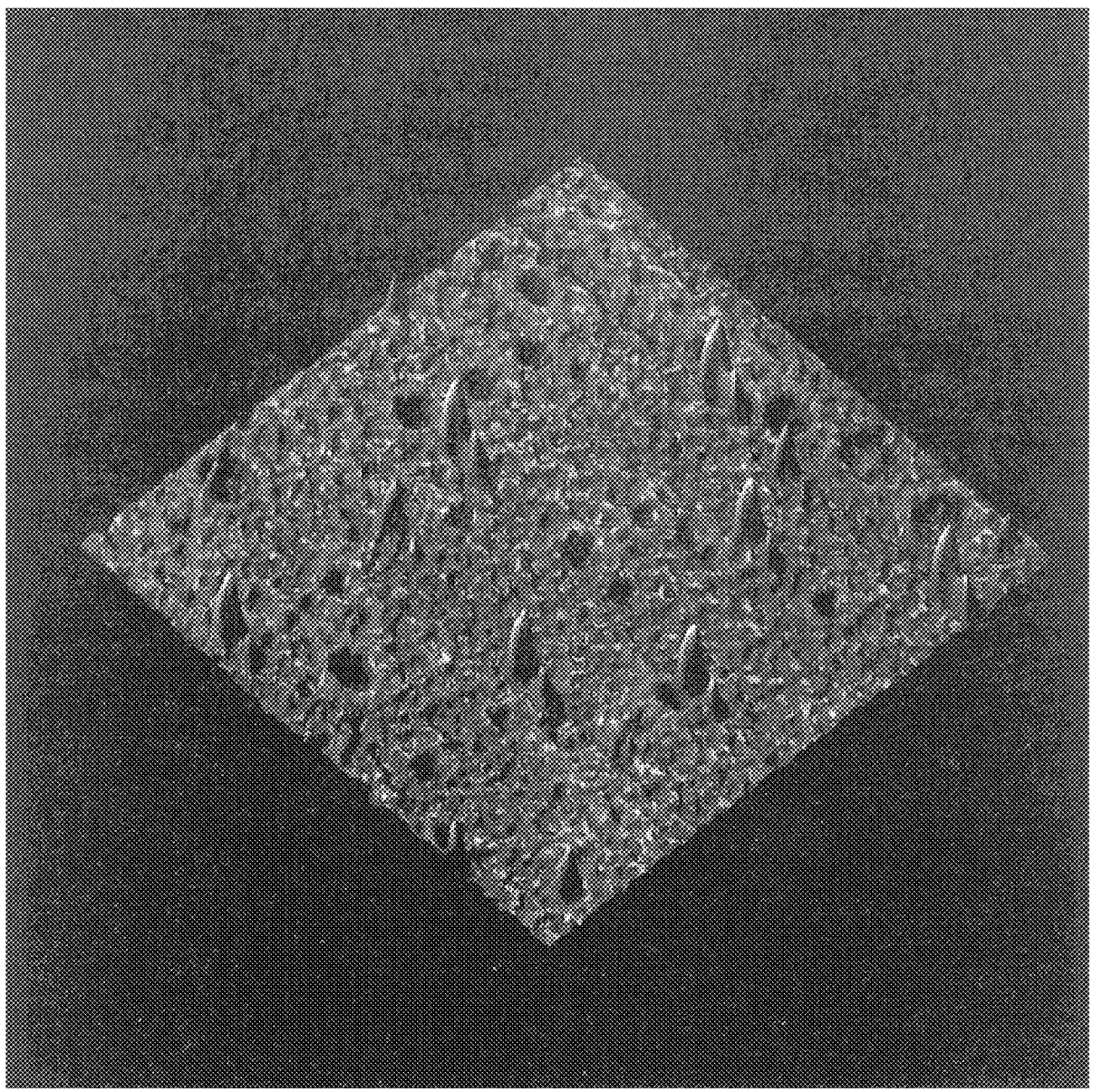
FIG. 3 is an AFM of 50/50 (wt %) PAA/PAETE polyimide prepared in accordance with this invention.

FIGS. 1, 2 and 3 show the AFM of a Polyimide layer derived from starting precursor ratios of 20/80, 80/20 and 50/50 (wt %) of PAA/PAETE.

Figure 4A:
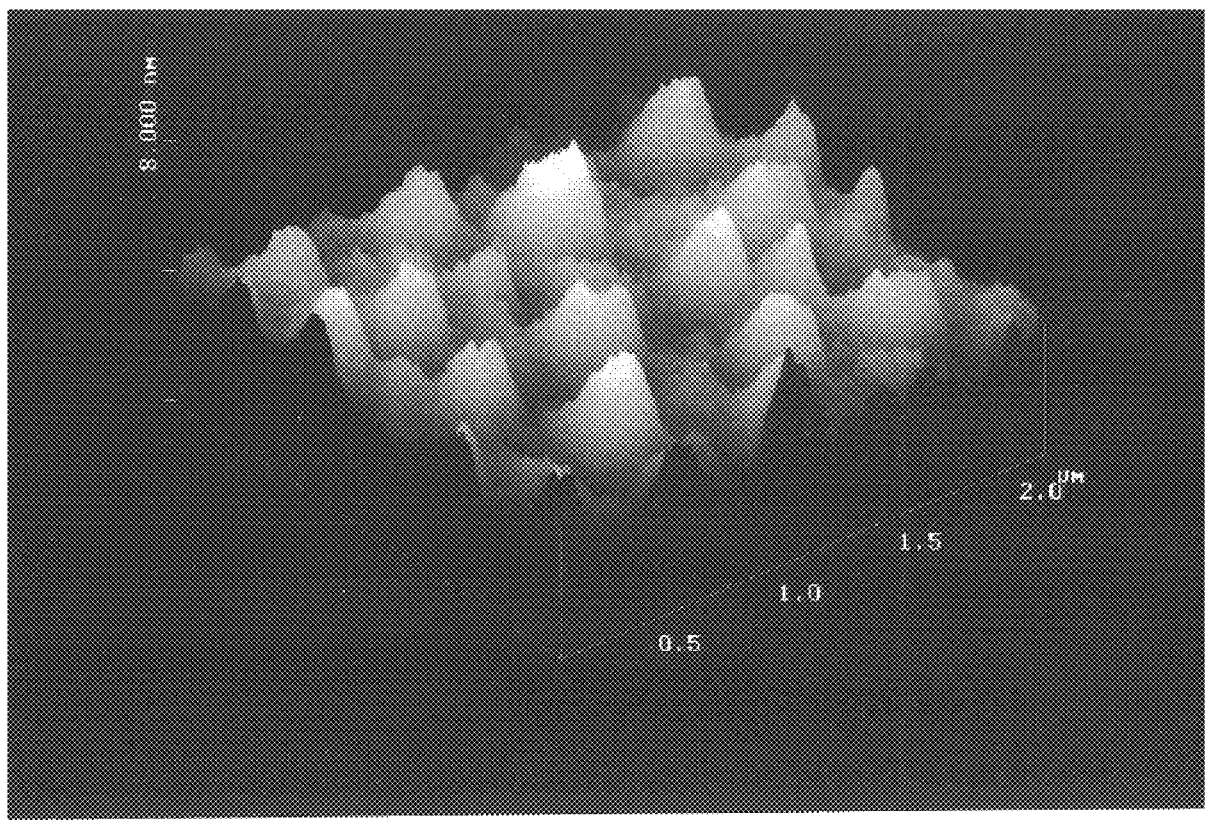
FIG. 4a is an AFM of a surface prepared under identical conditions as in FIG. 1.
Figure 4B:
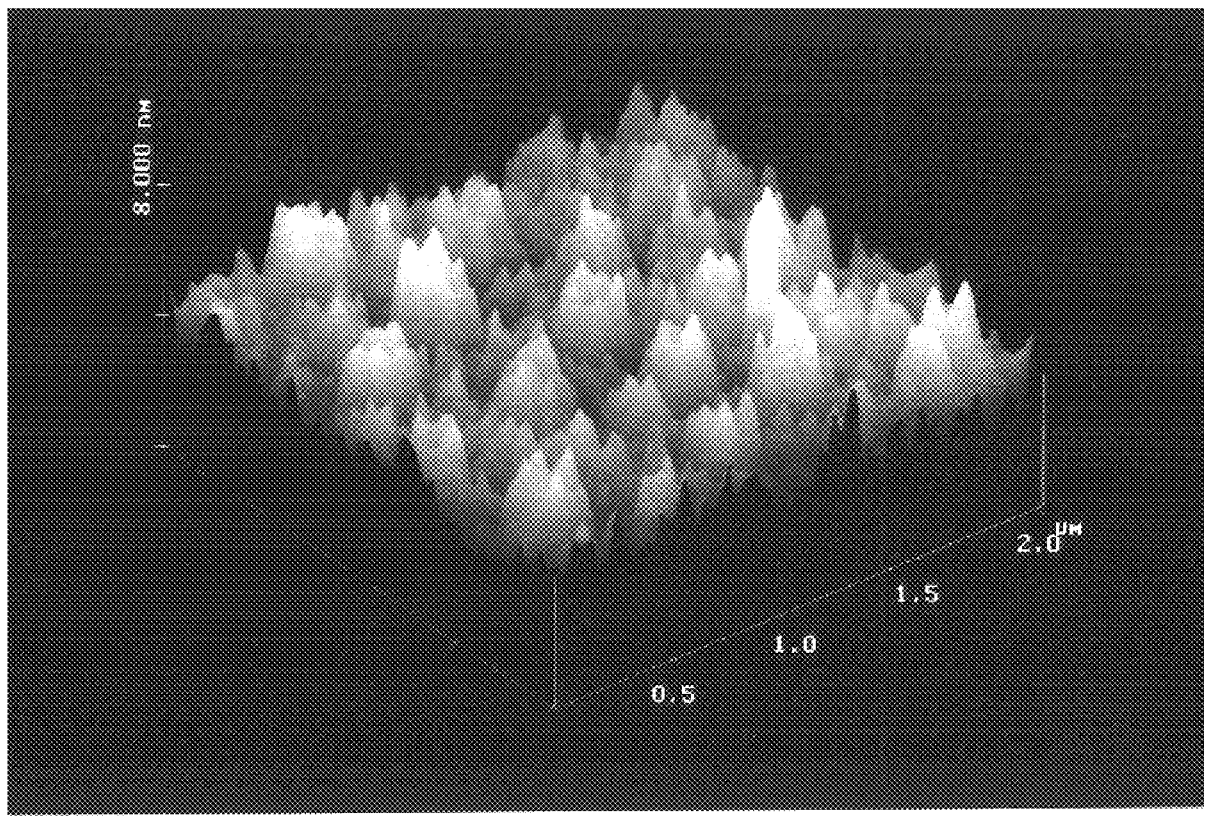
FIG. 4b is the same sample as 4a, followed by etching in 1M NaoM and ion exchange with 1M Acetic Acid, followed by drying at 70° C. for 1 hour.

Referring to FIG. 1, the topography of the surface can best be described as mounds, with a height of ~5.0 nm, and a base diameter of ~360 nm. The mounds represent the first polyimide phase (PI1) formed from the imidization of PAA. Such a topography is conducive to form a mechanically interlocked interface when metal is subsequently vapor deposited. In fact, when this pre-roughened surface is etched with 1M NaoH, the atomic force micrograph (compare FIG. 4a and 4b) shows a 30% decrease in the size of the mounds on the surface, thus reducing the propensity of the surface for good mechanical interlock.

The density of the mounds (i.e., mounds per unit area) and size is regulated by the kinetics of solvent evaporation rate, thickness of the coating, amount of solvent in the initial solution, drying or curing temperature, and the phase diagram of the system.

FIG. 2 shows the atomic force micrograph of a polyimide layer derived from 80% PAA and 20% PAETE. The PAA precursor (80% by wt) imidizes first, as described previously. Subsequent imidization of PAETE to PI2 leads to dimples on the surface that are ~11 nm deep and about 270 nm wide.

FIG. 3 shows the atomic force micrograph of a polyimide layer derived from PAA/PAETE (50/50 wt %). An imidization process, which is similar to that described above, results in dimples (~4 nm deep and ~450 nm wide) and mounds (~10-22 nm high and ~210-235 nm base diameter) on the polyimide surface.

In the practice of the present invention, 20 nm of chromium followed by 800 nm of copper is vapor deposited on the above films to produce a 1 $\mu$m thick film. The copper films were electrolytically thickened to ~10 $\mu$m for a peel test. In one instance, the peel test result indicated 15–20 g/mm peel strength for conventional PI made from pure PAA, and 50 g/mm for films made from 80/20 (PAA/PAETE) mixture, which contained a dimple-like surface. This represents close to 250% adhesion enhancement for vapor deposited copper. In another experiment, on a 50/50 mixture of BPDA-PDA precursor mixture, 900% enhancement was achieved.

Thus, according to the principles of the present invention, the adhesion between a vapor deposited metal and a polymer surface exhibiting characteristic roughness (comprised of mounds and dimples) can be enhanced by regulating the mound/dimple dimensions and the mound/dimple density. Since there is no conventional surface treatment, the enhancement is truly due to a better morphological and topographical modifications at the interface, such as, mechanical interlocking at the interface. The type of feature, i.e., dimples or mounds, can be adjusted by changing the precursor ratio in the starting polymer blend. The dimple/mound density and size can be tailored by regulating the phase separation kinetics before the film completely cures.

Figure 5:
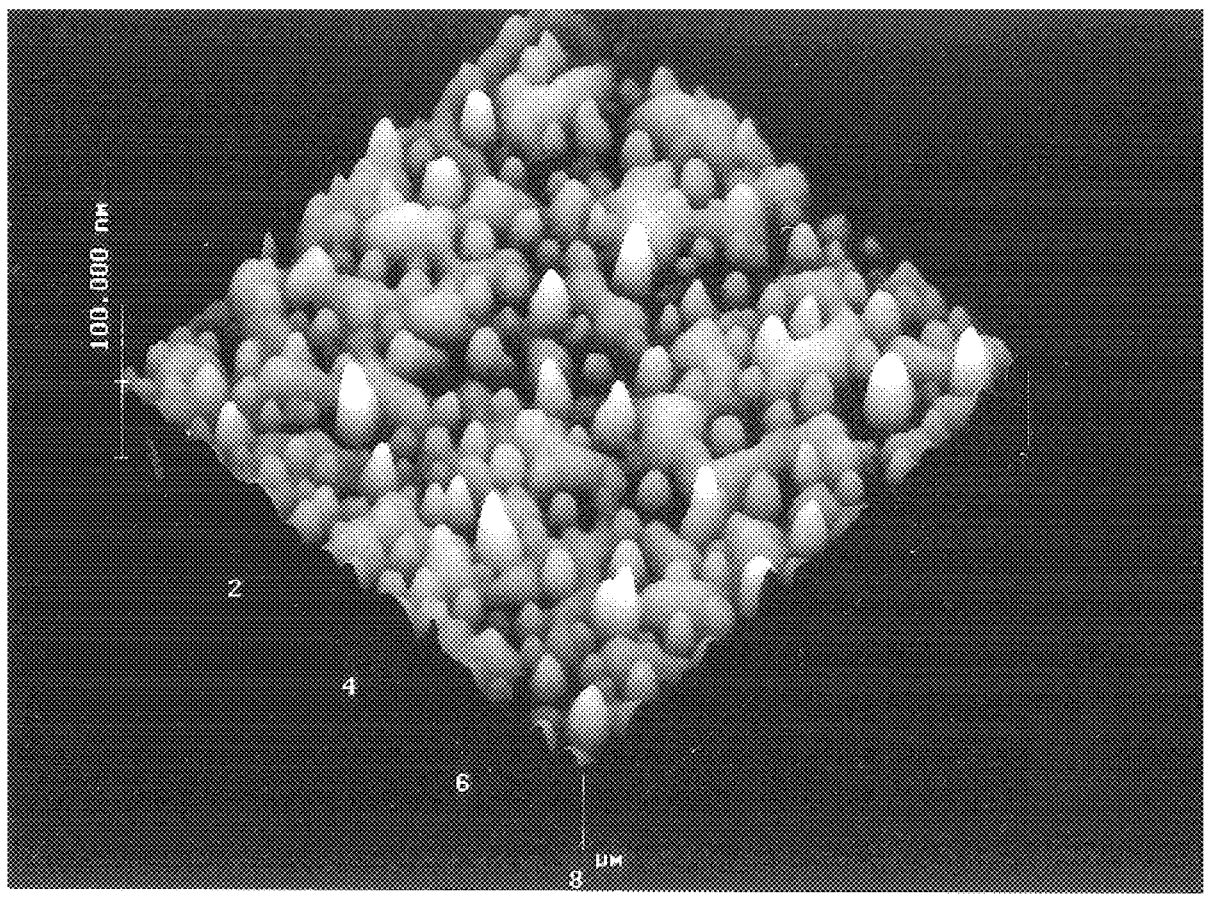
FIG. 5 is an AFM of 20/80 (wt %) polyethylene oxide/polyimide siloxane made from NMP solvent.

While the above description refers to polyimide, more specifically PMDA-ODA, and BPDA-PDA polyimide polymers coated with copper, the invention is equally applicable to any polymer, processible from precursors forming different phases. Furthermore, blends of two or more polymers that are not completely miscible also lead to spontaneously roughened films after curing. FIG. 5 shows the AFM micrograph of a polymer surface derived from a blend consisting of 20% polyethylene oxide and 80% polyimide siloxane in NMP solvent. The presence of two different polymer phases results in a rough topography that is receptive to subsequent metal deposition. While the present invention uses copper for vapor deposition, any other metal or metal alloy, which is amenable to vapor deposition, may be used. Also, in addition to NMP as a solvent, other polar solvents such as DMF, triglyme, diglyme, acetophenone and the like, are equally viable candidates.

While there has been described and illustrated a method of improving the adhesion between a vapor deposited metal and an in situ roughened polymer surface, it will be apparent to those skilled in the art that variations and modifications are possible without deviating from the broad spirit and principles of the present invention which are limited solely by the scope of the claims appended hereto.

Having thus described our invention what we claim as new and desire to secure as Letters Patent is:

1. A method of improving adhesion of a metal that is vapor deposited on a substrate comprising:

forming an organic dielectric layer from a blend that includes a solvent or solvent system and two or more polymer precursors or polymers or combinations thereof which are separable into two or more phases;

heating the organic dielectric layer to separate the dielectric layer into two or more phases exhibiting characteristic rough surface topography including at least one of dimples and mounds; and depositing a film of metal onto the resultant organic dielectric layer by vapor deposition, without any intermediate surface preparatory step of etching the organic dielectric layer.

2. A method of improving adhesion as set forth in claim 1, wherein said polymer precursors or said polymers are selected from the group comprising precursors of polyamic acid, polyamic acid ester and oligomers of polyepoxide and polyurethane and polymers selected from the group comprising polyimide, polyurethane, polyepoxide, polysulfane, polyether and polyamide.

3. A method of improving adhesion as set forth in claim 2, wherein said metal is selected from the group of Cu, Cr, Fe, Ni and Au.

4. A method of improving adhesion as set forth in claim 2, wherein said organic dielectric layer is a polyimide.

5. A method of improving adhesion as set forth in claim 4, wherein said polyimide is derived from two precursors comprising polyamic acid and polyamic acid ester.

6. A method of improving adhesion as set forth in claim 5, wherein said two precursors of polyamic acid and polyamic acid ester are present in ratios ranging from 10/90 to 90/10 (wt %) polyamic acid to polyamic acid ester, respectively.

7. A method of improving adhesion as set forth in claim 1, wherein said two precursors of polyamic acid and polyamic acid are combined in a ratio of 20/80 (wt %), polyamic acid to polyamic acid ester, respectively, to give a resultant film which exhibits said mounds on the surface.

8. A method of improving adhesion as set forth in claim 1, wherein said two precursors of polyamic acid and polyamic acid ester are combined in a ratio of 80/20 (wt %) polyamic acid to polyamic acid ester, respectively, to give a resultant film which exhibits said dimples on the surface.

9. The method according to claim 1, wherein said characteristic rough surface topography including at least one of said mounds and said dimples is regulated by a composition of said blend, and a characteristic length scale including a size of said mounds and said dimples is regulated by phase separation kinetics.

10. The method according to claim 1, wherein said blend results in a spontaneous nanoscale surface roughening, and wherein said film of metal is formed directly on said organic dielectric layer and devoid of a surface cleaning prior to said vapor deposition.

11. The method according to claim 1, wherein said depositing a film of metal onto the resultant organic dielectric layer by vapor deposition includes depositing the film of metal onto the resultant organic dielectric layer by vapor deposition, without any intermediate surface preparatory step of cleaning the organic dielectric layer.

12. The method according to claim 1, wherein said mounds have a height of approximately 5.0 nm and a base diameter of approximately 360 nm.

13. The method according to claim 1, wherein said dimples have a depth of approximately 11 nm and a width of approximately 270 nm.

14. The method according to claim 1, wherein both of said dimples and said mounds are provided, said dimples having a depth of approximately 4 nm and a width of approximately 450 nm, and said mounds having a height of approximately 10 to 22 nm and a base diameter of approximately 210 to 235 nm on the surface of the organic dielectric layer.

15. The method according to claim 1, wherein a type of feature of said characteristic rough surface topography is formed by changing a precursor ratio in the starting polymer blend, and a density and size of said at least one of said dimples and mounds are tailored by regulating phase separation kinetics before the film of metal deposited on said organic dielectric layer completely cures.

16. The method according to claim 1, wherein at least one of said substrate and said metal comprises aluminum.

17. The method according to claim 16, wherein said method is for forming a semiconductor integrated circuit chip, said vapor deposition being a dry process devoid of a seeding of Pd anchoring sites on the dielectric layer, and wherein a product formed by said method has a corrosion less than that of an electrolysis method of forming said metal to said organic dielectric layer.

18. A composite comprising a substrate and a layer of metal thereon separated by an intermediate layer comprising, prior to receiving said layer of metal thereon, an unetched organic dielectric film, wherein said dielectric film exhibits characteristic rough surface topography including at least one of dimples and mounds, at the interface between said layer of metal and said dielectric film resulting from the separation of a blend that includes a solvent or solvent system and two or more polymer precursors or polymers or combinations thereof into two or more phases, wherein said blend results in a spontaneous nanoscale surface roughening, and said layer of metal comprises vapor deposited metal and is formed directly on said organic dielectric film, said organic dielectric film being uncleaned and unetched prior to vapor deposition.

19. The composite of claim 18 wherein said film is a polyimide; or is at least two of polyimide, polyurethane, polyepoxide or a blend of one or more of the foregoing and one or more of polysulfane, polyether and polyamide; or two or more of polysulfane, polyether and polyamide.

20. A composite comprising a layer of metal deposited onto an unetched organic dielectric film, wherein said dielectric film exhibits characteristic rough surface topography including at least one of dimples and mounds, at the interface between said layer of metal and said dielectric film resulting from the separation of a blend that includes a solvent or solvent system and two or more polymer precursors or polymers or combinations thereof into two or more phases, wherein said blend results in a spontaneous nanoscale surface roughening, wherein said layer of metal comprises vapor deposited metal and is formed directly on said organic dielectric film and devoid of a surface cleaning of the organic dielectric film prior to vapor deposition.

* * * * *